United States Patent [19]

Schaad

[11] 4,275,462
[45] Jun. 23, 1981

[54] ELECTRONIC TIMEPIECE
[75] Inventor: Jean Schaad, Gorgier, Switzerland
[73] Assignee: Ebauches S.A., Neuchatel, Switzerland
[21] Appl. No.: 129,406
[22] Filed: Mar. 11, 1980
[30] Foreign Application Priority Data
Mar. 16, 1979 [CH] Switzerland ............... 2502/79
[51] Int. Cl.³ ............................................. G04C 23/02
[52] U.S. Cl. ........................................................ 368/88
[58] Field of Search .................. 368/87, 88, 159, 184, 368/200; 320/1; 333/177 R, 177 V

[56] References Cited
U.S. PATENT DOCUMENTS
4,045,953  9/1977  Miyazaki ..................... 368/159

Primary Examiner—Vit W. Miska
Attorney, Agent, or Firm—Silverman, Cass & Singer, Ltd.

[57] ABSTRACT

An electronic timepiece has a variable capacitor for adjustment of the rate of the timepiece by varying the oscillation frequency of an oscillator of the timepiece. One of the electrodes of the variable capacitor is constituted by an area of one of the conductive tracks of a printed circuit of the timepiece. The other electrode of this capacitor is constituted by a layer of a conductive material carried by an insulating pellet secured to the end of a metal arm pivotally mounted on the printed circuit substrate and which is electrically connected to the earth or "ground" of the timepiece circuit. The capacitance of the capacitor formed in this manner varies with the position of the pellet with respect to said area providing said one electrode.

3 Claims, 2 Drawing Figures

ELECTRONIC TIMEPIECE

BACKGROUND OF THE INVENTION

1. Field of the Invention

This invention relates to an adjustable capacitor device for an electronic timepiece of the type comprising a source of electric power, a piezo-electric resonator, an oscillator circuit connected to said resonator, a printed circuit and a variable capacitor connected between the resonator and one of the terminals of the current source for adjustment of the output frequency of the oscillator to adjust the rate of the timepiece.

2. Description of the Prior Art

In timepieces of the foregoing type, the variable capacitor, generally called a "trimmer", consists of a miniaturized independent component, secured on the frame of the module of the timepiece. This trimmer is a relatively expensive component, its reliability is often not satisfactory and its mounting is a very expensive operation. Moreover, because of its small dimensions it is not possible to limit the movement range of its rotor by means of abutting stop members. Consequently, the capacitance changes continuously throughout the complete rotation of the rotor from a minimum value to a maximum value then, anew, to the minimum value. Hence, a watchmaker who wishes to adjust the rate of a watch cannot know in which direction he should turn the rotor to regulate the rate in the required sense.

SUMMARY OF THE INVENTION

The present invention has for its object to overcome the foregoing disadvantages and drawbacks of known trimmers, by means of a new and original construction of an adjustable capacitor device. To this end preferably one electrode of the capacitor is provided by a track of the printed circuit of the timepiece, while the other is provided by a conductive layer on a small insulating plate carried by an arm pivotally mounted on the printed circuit.

Other features of the invention will be apparent from the following description, accompanying drawings and appendant claims, the scope of the invention not being limited to the drawings themselves as they are only for the purpose of illustrating a way in which the principles of the invention can be applied. Other embodiments of the invention utilizing the same or equivalent principles may be used and structural changes may be made as desired by those skilled in the art without departing from the present invention and the purview of the appended claims.

BRIEF DESCRIPTION OF THE DRAWINGS

The accompanying drawings show, by way of example, one embodiment of the invention. In the drawings.

DETAILED DESCRIPTION OF THE PREFERRED EMBODIMENT

Figure 1:
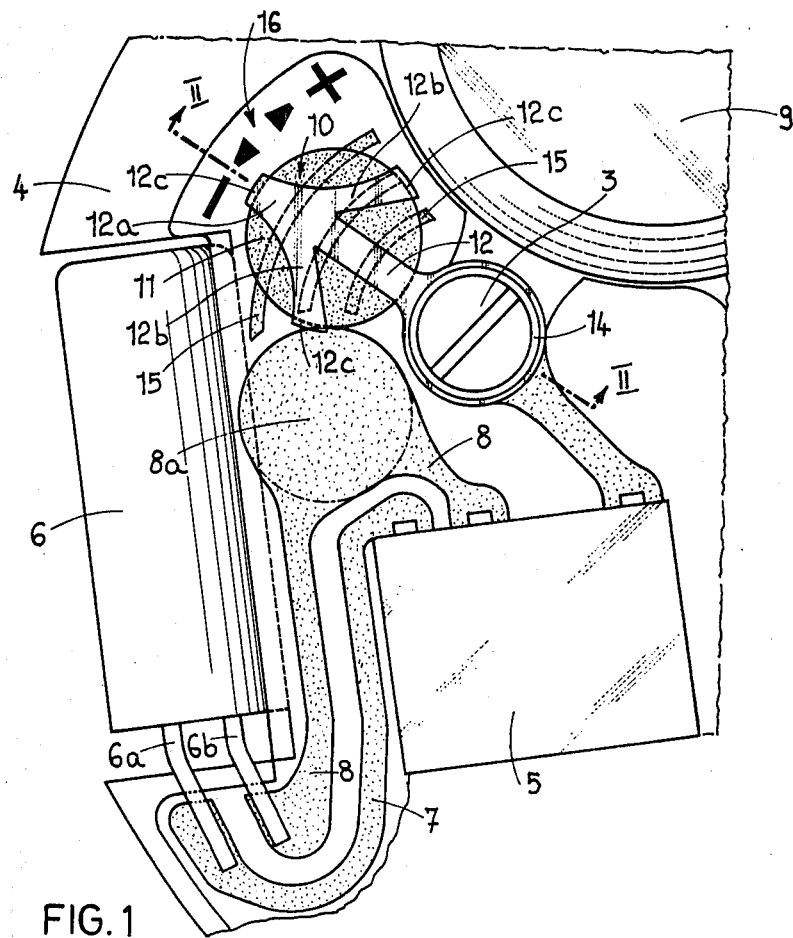
FIG. 1 is a plan view of a part of an electronic watch in accordance with the invention.

The watch partially shown in the drawings is provided with a baseplate 1 (FIG. 2) on which is secured, by means of pillars 2 (only one of which is shown) and screws 3, the module of the watch the frame of which is constituted by the substrate 4 of a printed circuit. The components of this module which are visible in the drawings are constituted by an integrated circuit 5 containing all the electronic circuits of the watch, especially the oscillator serving as a time-base, and a quartz resonator 6. The connecting wires 6a and 6b of the resonator 6 are connected to the oscillator circuit by two conductive tracks 7 and 8 carried by the substrate 4 of the printed circuit. The supply battery, providing a source of electric power and designated by reference 9, is partially shown in FIG. 1. One of the battery terminals is connected, in a manner not shown, to the baseplate 1 which constitutes the earth or "ground" of the electric circuit of the watch.

The track 8 of the printed circuit is provided with a circular area 8a constituting one of the electrodes of a variable capacitor connected, in a conventional manner, between one of the terminals of the resonator and the earth plate of the watch, so as to allow for adjustment of the frequency of oscillation. The second electrode of this capacitor is constituted by a metallic layer 10 affixed on the outer face of a small plate 11 of dielectric material, for example ceramic material, having the shape of a circular pellet. This plate is mounted at the end 12a of a metal arm 12, made of beryllium bronze for example, which pivots on the stem of the illustrated screw 3. The end 12a of the arm 12 terminates in a portion bent at a right angle and includes two divergent branches 12b the end portions of which are also bent at right angles. These three bent portions, all of which are designated by the reference 12c, form clips retaining the small plate 11. The portion 12a of the arm 12 and the branches 12b are moreover slightly cambered so as to bear on the metallic layer 10, which is thus in electrical contact with the arm 12. This arm yields against its own elasticity so as resiliently to press the small plate 11 against the substrate 4.

The arm 12, and consequently the conductive layer 10 carried by the small plate 11, is connected to ground since it is nipped between two washers 13 and 14 (FIG. 2) one of which, namely the washer 14, is of metal and is in electrical contact with the head of the screw 3 which is itself connected to ground through the pillar 2 which is also of metal.

With the screw 3 slackened off, the small plate 11 can be moved to any position intermediate that in which it is coaxially in register with the circular area 8a forming a capacitor electrode, which it then overlaps entirely, and that extreme position (shown in FIG. 1) in which it is entirely clear, as seen in plan view, of the area 8a.

More generally it is not necessary that the plate 11 is entirely clear of the area 8a for its extreme position. For this extreme position the plate 11 may partially overlap the area 8a. The extreme position depends on the required maximum range of frequency adjustment.

Figure 2:
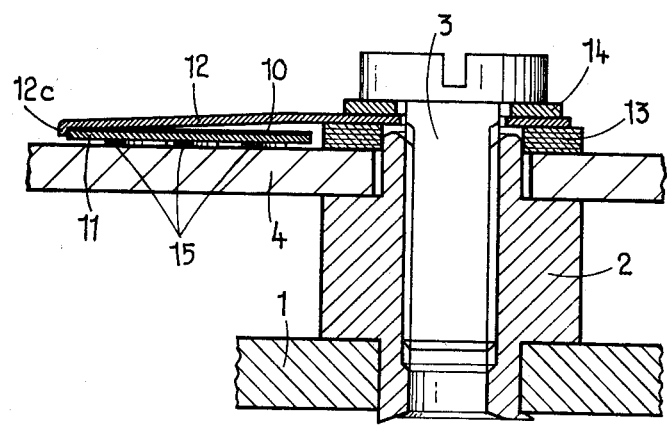
FIG. 2 is a sectional view on the line II—II in FIG. 1, to a larger scale.

As the conductive tracks of the printed circuit, especially the area 8a, do not have negligible thickness, support tracks 15 are positioned in the vicinity of this area 8a. These tracks 15 are not electrically connected to the other tracks of the printed circuit, and serve to support the small plate 11 which bears on them when it occupies positions in which the pressure of the arm 12 would yield and otherwise rock the plate 11. The tracks 15 thus constitute spacer members which ensure that the small plate 11 remains accurately parallel to the substrate in any adjusted position and is at the right level when it engages the area 8a as it moves on to the latter from the position to the side as shown in FIG. 1.

The capacitance of the capacitor constituted by the area 8a and the conductive layer 10 on the small plate 11, and consequently the frequency of the oscillator, always varies in a sense determined by the direction of adjusting movement of the small plate 11. Thus it is possible to indicate on the substrate 4, as at 16, the sense in which it is necessary to move the plate 11 to advance or retard the watch, according to whether the watch is losing or gaining time, respectively. These indications are identical to those which are carried by the balance cock of mechanical watches and which are well known to all watchmakers.

The screw 3 could be of stepped form, the arm 12 then being mounted so as to be frictionally gripped between the washers 13 and 14 so that it can be turned, to regulate the watch, without it being necessary to slacken off the screw.

Also, the area 8a and the conductive layer 10 may be of a non-circular shape determined in such manner that the variation of frequency of the oscillator as a function of the angle of movement of the arm 12 is at least approximately linear.

These and other structural changes may be made, and other embodiments of the invention utilizing the same or equivalent principles may be employed, as desired by those skilled in the art without departing from the present invention and the purview of the appended claims.

I claim:

1. In an electronic timepiece having an insulating substrate carrying a plurality of conductive tracks, an adjustable capacitor comprising:
    a first electrode of said capacitor formed by a first conductive area on said substrate;
    an arm;
    an insulating plate rigidly secured to said arm and having a first and a second substantially flat face;
    a second electrode of said capacitor formed by a second conductive area on the first face of said plate; and
    means for pivotally mounting said arm for movement between a first end position where said second conductive area is substantially parallel to, and substantially completely overlaps said first conductive area, and a second end position where there is substantially no overlapping between said first and second conductive areas, whereby the capacitance of said capacitor depends on the position of said conductive area between said first and second end positions.

2. The adjustable capacitor device of claim 1, wherein said first conductive area forms part of said conductive tracks.

3. The adjustable capacitor device of claim 1, wherein said arm is resilient and adapted to apply said plate against said substrate.

* * * * *